(12) United States Patent
Inomata

(10) Patent No.: US 6,891,277 B2
(45) Date of Patent: May 10, 2005

(54) SEMICONDUCTOR DEVICE ALIGNMENT MARK HAVING OXIDATION PREVENTION COVER FILM

(75) Inventor: Daisuke Inomata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/305,953

(22) Filed: Nov. 29, 2002

(65) Prior Publication Data

US 2004/0000729 A1 Jan. 1, 2004

(30) Foreign Application Priority Data

Jul. 1, 2002 (JP) ......................................... 2002-192104

(51) Int. Cl.⁷ ............................................ H01L 23/544
(52) U.S. Cl. ...................... 257/797; 257/701; 257/750; 257/758; 257/760; 257/773; 257/771
(58) Field of Search ................................ 257/797, 701, 257/750, 758, 760, 773, 771

(56) References Cited

U.S. PATENT DOCUMENTS

| | | | | |
|---|---|---|---|---|
| 5,834,349 A | * | 11/1998 | Tseng ........................... | 438/253 |
| 6,288,419 B1 | | 9/2001 | Prall et al. | |
| 6,376,325 B1 | | 4/2002 | Koo | |
| 6,465,872 B2 | * | 10/2002 | Tada ............................ | 257/620 |
| 6,509,593 B2 | * | 1/2003 | Inoue et al. ................. | 257/295 |
| 6,538,272 B2 | * | 3/2003 | Yamazaki et al. ........... | 257/295 |
| 6,570,203 B2 | * | 5/2003 | Hikosaka et al. ............ | 257/295 |
| 6,590,252 B2 | * | 7/2003 | Kutsunai et al. ............. | 257/310 |
| 6,677,682 B1 | * | 1/2004 | Fujiki et al. ................. | 257/797 |
| 2002/0173139 A1 | | 11/2002 | Kweon | |
| 2003/0157780 A1 | * | 8/2003 | Farrar et al. ................. | 438/401 |
| 2003/0207535 A1 | * | 11/2003 | Kutsunai et al. ............. | 438/253 |

FOREIGN PATENT DOCUMENTS

| | | |
|---|---|---|
| JP | 9-223656 | 8/1997 |
| JP | 2001-284204 | 10/2001 |
| JP | 2002-373974 | 12/2002 |

\* cited by examiner

*Primary Examiner*—Nathan J. Flynn
*Assistant Examiner*—Remmon R. Fordé
(74) *Attorney, Agent, or Firm*—Volentine Francos & Whitt, PLLC

(57) ABSTRACT

Alignment marks of a semiconductor device, formed prior to a step of applying heat treatment in an oxygen atmosphere, include an insulating film, a groove formed in the insulating film during a step of defining a contactor hole in a device part, a metal film formed at least on sidewalls of the groove during a step of burying the contactor hole in the device part, and a cover film formed on the insulating film to cover the metal film formed in the groove for prevention of oxidation of the metal film during heat treatment applied in an oxygen atmosphere.

14 Claims, 8 Drawing Sheets

221  211  200

221
203
202
201

221
203
204
201

321  310  300

321
303
302
301

321
303
304
301

SEMICONDUCTOR DEVICE ALIGNMENT MARK HAVING OXIDATION PREVENTION COVER FILM

FIELD OF THE INVENTION

The invention relates to alignment marks for use in a photolithographic step in the manufacture of a semiconductor device, requiring a step of applying heat treatment in an oxygen atmosphere, and in particular, to alignment marks of a semiconductor device using ferroelectrics or metal oxide dielectrics.

BACKGROUND OF THE INVENTION

Since the invention brings about similar advantageous effects on both a semiconductor device using metal oxide ferroelectrics (referred to hereinafter merely as ferroelectrics) and a semiconductor device using metal oxide dielectrics (referred to hereinafter merely as high dielectrics), description given hereinafter will center on the semiconductor device using ferroelectrics.

Attention has been focused on a ferroelectrics memory as the semiconductor device using the ferroelectrics. Research and development on a memory using the ferroelectrics have since been very active because it is a nonvolatile memory wherein the contents of the memory are not erased taking advantage of a polarization phenomenon of the ferroelectrics even if power supply is cut off while random access can be made thereto.

For a ferroelectric film, there has since been in commercial application material using a layered bismuth perovskite which is a layered bismuth (Bi) compound: $SrBi_2Ta_2O_9$ (a group of series of compounds including those having a composition which is a variation to this composition, and those with such an additive as represented by niobium (Nb) added thereto are referred to hereinafter as SBT), and a lead zirconate titanate: $Pb(Zr_{1-x}Ti_x)O_3$ (a group of series of compounds including those having a composition which is a variation to this composition, and those with such an additive as lanthanum (La), calcium (Ca), and so forth, added thereto are referred to hereinafter as PZT).

Further, ferroelectric materials in a study stage include bismuth titanate with lanthanum added thereto, called BLT, those ferroelectric materials described in the foregoing with other dielectric material in solid solution form, added thereto, and so forth, and those ferroelectric materials described above have one thing in common in that heat treatment needs to be applied thereto in an oxygen atmosphere for exhibiting ferroelectricity as oxide crystals in respective cases, so that all those ferroelectric materials can gain equivalent advantageous effects by virtue of the present invention. Hence, the case of using a ferroelectric film, in particular, a SBT film will be described in detail hereinafter.

As described above, the ferroelectrics such as SBT, and so forth are all metal oxide crystals, and require heat treatment at a high temperature in a range of 600 to 800° C. at the time of crystallizing those materials, and in order to heal process damage incurred during sputtering, etching, etc., in the back-end steps of manufacturing. In addition, the heat treatment is applied in an oxygen atmosphere in most cases, so that in the case of a semiconductor device fabricated prior to the formation of a ferroelectric capacitor, comprising wiring made of tungsten (W) etc, and a contactor structure, these constituents are easily oxidized in the oxygen atmosphere, and upon oxidation, conductivity thereof is lost, thereby necessitating some countermeasure for prevention of oxidation.

Meanwhile, in the case of manufacturing a semiconductor device by use of photolithographic techniques, there is the need of a pattern yet to be formed being superposed on (aligned with) a pattern already formed on an underlying layer with precision. Accordingly, aside from a device pattern, alignment mark patterns intended solely for executing such alignment with precision are simultaneously formed.

Principal alignment marks fall into three broad categories, that is, a mark (search mark) for rough alignment, to be read by an optical aligner when subjecting a resist (photosensitive agent) to exposure by use of the optical aligner, a mark (fine mark) for precision alignment, and an alignment measurement mark for detection of misalignment by use of an alignment measuring instrument after exposure and development. These alignment marks have no direct bearing on the function of a semiconductor device, but are indispensable in the manufacturing the semiconductor device.

As described above, the principal alignment marks have three varieties, however, since a problem with each of the three varieties and a countermeasure for solving the problem are common to all of them, the alignment measurement mark will be described hereinafter. FIG. 7 shows a typical construction of alignment measurement marks formed by a conventional method, FIG. 7A is a schematic plan view of the alignment measurement marks, FIG. 7B a sectional view thereof, taken along line a—a of an out-box in FIG. 7A, and FIG. 7C a sectional view thereof, taken along line b—b of an in-box in FIG. 7A. The alignment measurement marks are made up of two rectangular patterns constituting the out-box and the inbox, respectively. For example, in the case of aligning a pattern layer 1 with a pattern layer 2, an out-box 400 is first formed with the pattern layer 1 to serve as an underlying layer against the pattern layer 2, and subsequently, an in-box 410 is formed in the step of applying photolithographic techniques to the pattern layer 2.

Conversely, in the case of forming the in-box with the pattern layer 1, the out-box is formed with the pattern layer 2. The in-box (or the out-box) formed with the pattern layer 2 is made up of a resist. The alignment measurement marks made up of the out-box and the in-box are measured by the alignment measuring instrument, thereby detecting an amount of discrepancy in alignment of the pattern layer 2 relative to the pattern layer 1. If the amount of the discrepancy is greater than a specified value, the resist is removed in its entirety, and a pattern 2 is again formed with the use of an alignment correction value as obtained. After the photolithographic step, a resist pattern of the in-box (or the out-box) is subjected to etching except the step of ion implantation and is left out on a wafer. Accordingly, it is indispensable from a manufacturing point of view to suppress oxidation and exfoliation of a mark part to a minimum in back-end steps.

FIG. 7 is view corresponding to a case where the out-box is formed when forming a BMD (Buried Metal on Diffusion Layer) contactor, and thereafter, the in-box is formed in succeeding steps. After forming a groove in an interlayer insulating film 401 in a BMD contactor hole etching step, a metal film 402, made of tungsten (W) etc, is formed by the CVD method, and thereafter, a CMP (Chemical Mechanical Polishing) is applied thereto or the entire surface thereof is etched back. The figure shows a state where residue of tungsten (W) remains in the form of a sidewall at respective edges of the out-box. Subsequently, an interlayer insulating film 403 is deposited, and the interlayer insulating film 403 is normally of a layered structure including not only a silicon oxide film but also a silicon nitride film, and so forth, in order to prevent oxidation of underlying tungsten (W).

Further, after applying a photolithographic step to the in-box, etching is applied to the interlayer insulating film 403 in a contactor hole etching step, and thereafter, a metal film 404, made of tungsten (W) etc, is formed by the CVD method, subsequently applying the CMP (Chemical Mechanical Polishing) thereto, or etching back the entire surface thereof. A portion of the metal film 404, which is residue of tungsten (W), remains at respective edges and the bottom of the in-box. Since there exists a stepped part on a portion of the interlayer insulating film 403 as well, on top of the out-box, there is a possibility of portions of the metal film 404 also remaining therein at this point in time.

Accordingly, remaining portions of the metal film 404 easily undergo intense oxidation during heat treatment in an oxygen atmosphere, and so forth, applied for crystallization of the ferroelectrics in back-end steps. Remaining portions of the metal film 402 do not have sufficient oxidation resistance either. Because of difference in level of the interlayer insulating film due to the formation of the out-box, the silicon nitride film in regions where tungsten residue remains does not have a sufficient coating, and in addition, the silicon oxide film of the interlayer insulating film allows oxygen to be permeated (diffused), so that, as shown in FIG. 8, tungsten (W) is seen intensely oxidized due to heat treatment in an oxygen atmosphere, accompanying the formation of the ferroelectrics. Occurrence of such intense oxidation as causing distortion of the shape of the marks will cause very serious problems from the viewpoint of manufacturing a semiconductor device, such as exfoliation, generation of particles in the back-end steps of manufacturing, and so forth.

SUMMARY OF THE INVENTION

The invention has been developed in view of the above-described problems encountered by the conventional alignment marks of a semiconductor device, and it is an object of the invention to provide novel and improved alignment marks of a semiconductor device using metal oxide dielectrics, solving a problem of exfoliation due to oxidation of the marks while maintaining the original function as alignment marks by devising a novel alignment mark construction of a semiconductor device comprising constituents requiring heat treatment in an oxygen atmosphere such as ferroelectrics.

To that end, in a first aspect of the invention, there is provided alignment marks of a semiconductor device, formed prior to the step of applying heat treatment in an oxygen atmosphere, said alignment marks comprising an insulating film, a groove formed in the insulating film during a step of defining a contactor hole in a device part, metal formed in the groove during a step of burying the contactor hole in the device part, and a film (cover film) covering at least the metal for prevention of oxidation of the metal. With these features, another insulating film may be formed on the insulating film and underneath the film for prevention of oxidation of the metal.

With the conventional alignment marks, a drawback has been experienced in that since residue of the metal formed in the step of burying the contactor hole remains on the sidewalls or bottom of the groove due to the formation of the alignment marks in the step of forming the contactor hole, and coating on the metal, provided by an insulating film to be formed thereafter, becomes insufficient owing to a stepped-level profile of the groove, the metal undergoes oxidation at the time of annealing for crystallization of a ferroelectric film, and at the time of heat treatment applied thereafter in order to restore ferroelectricity from process damage. However, with adoption of the above-described construction wherein the cover film for prevention of oxidation of the metal is formed on the insulating film in a mark region, exfoliation of the marks can be prevented.

Further, with a groove width being in a range of about 3 to 6 μm as in the conventional case, even if the cover film intended for prevention of diffusion of oxygen is formed, satisfactory prevention of oxidation has not been possible because of a poor coating condition on the metal due to the stepped-level profile in the mark region, however, if the groove is filled up with the metal by rendering the groove width narrower to a range of about of 0.6 to 1.0 μm, this will correct the stepped-level profile to thereby cause the cover film to sufficiently cover the metal, so that prevention of oxidation in the mark region can be significantly improved.

Still further, the cover film introduced for the purpose of preventing oxidation of the mark region has poor adhesion property against the insulating film in an underlying layer, and consequently, can cause the marks to become susceptible to exfoliation in back-end steps if deposited extensively on the insulating film. However, by rendering the cover film, which used to cover the mark region in whole, narrower in width to the extent of several μm larger than the width of the groove so as to cover only the top thereof, it is possible to obtain an advantageous effect on exfoliation in the back-end steps while maintaining oxidation resistance.

In addition, in the case where a silicon nitride film is formed to a sufficient thickness after the groove formed in the insulating film is rendered narrower in width, and is filled up with the metal, thereby planarizing the mark region, the coating condition of the insulating film becomes excellent because the mark region does not have the stepped-level profile, and the silicon nitride film is able to prevent diffusion of oxygen during heat treatment applied in an oxygen atmosphere, so that oxidation of the metal can be prevented without forming the cover film on top of the silicon nitride film or the insulating film.

BRIEF DESCRIPTION OF THE DRAWINGS

FIG. 1(A) is a schematic plan view thereof, FIG. 1(B) a sectional view thereof, taken along line a—a in FIG. 1(A), and FIG. 1(C) a sectional view thereof, taken along line b—b in FIG. 1(A);

FIG. 2(A) is a schematic plan view thereof, FIG. 2(B) a sectional view thereof, taken along line a—a in FIG. 2(A), and FIG. 2(C) a sectional view thereof, taken along line b—b in FIG. 2(A);

FIG. 3(A) is a schematic plan view thereof, FIG. 3(B) a sectional view thereof, taken along line a—a in FIG. 3(A), and FIG. 3(C) a sectional view thereof, taken along line b—b in FIG. 3(A);

FIG. 7(A) is a schematic plan view thereof, FIG. 7(B) a sectional view thereof, taken along line a—a in FIG. 7(A), and FIG. 7(C) a sectional view thereof, taken along line b—b in FIG. 7(A)

PREFERRED EMBODIMENT OF THE INVENTION

Figure 1A:
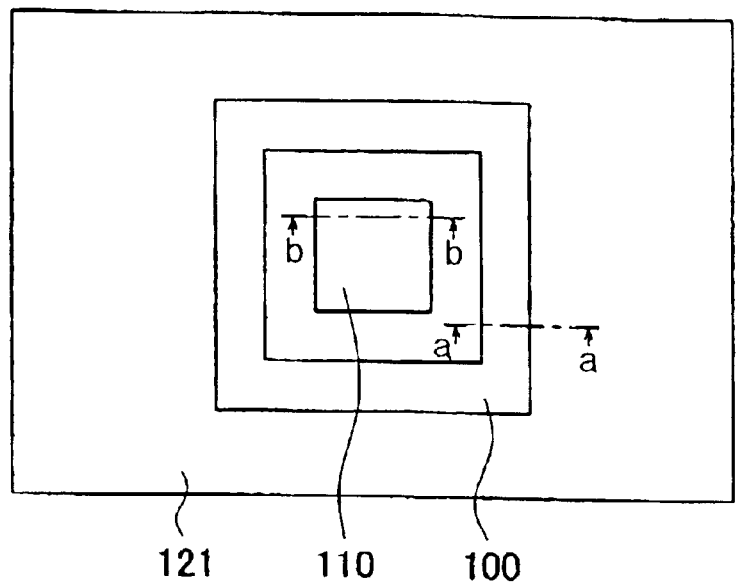
FIGS. 1(A) to 1(C) are views showing a first embodiment of alignment marks of a semiconductor device, according to the invention.

Preferred embodiments of alignment marks of a semiconductor device, according to the invention, are described in detail hereinafter with reference to the accompanying drawings. In the present specification and figures, constituent elements having a substantially identical function and construction are denoted by like reference numerals, thereby omitting duplicated description thereof.

First Embodiment

Figure 1B:
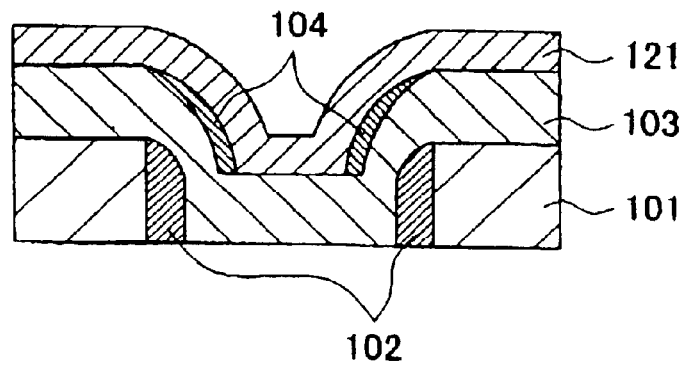
Figure 1C:
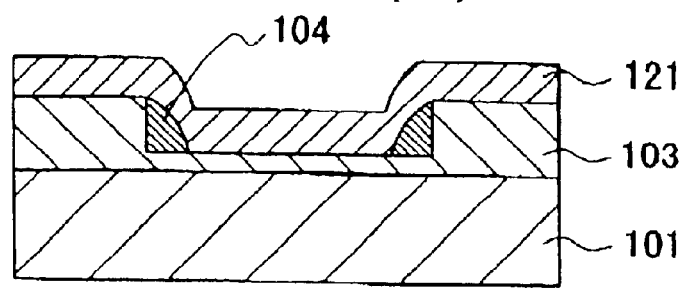

FIG. 1(A) is a schematic plan view of a first embodiment of alignment measurement marks of a semiconductor device, according to the invention, FIG. 1(B) a sectional view thereof, taken along line a—a of an out-box shown in FIG. 1(A), and FIG. 1(C) a sectional view thereof, taken along line b—b of an in-box shown in FIG. 1(A). After forming an interlayer insulating film 101 of the well-known construction on a semiconductor substrate by the well-known method, a mark region is also formed in, for example, a BMD contactor hole etching step. Such a contactor hole etching step is not limited to the formation of a BMD contactor hole, but is applied for all contactor holes to be formed prior to the step of fabricating a ferroelectric capacitor.

An out-box 100 shown in FIG. 1 is formed in the contactor hole etching step. There can be a case where an in-box 110 is first formed instead of the out-box 100, however, for the sake of clarity, only a case where the out-box is first formed will be described hereinafter. A width of a groove of the out-box 100, formed at this point in time, that is, an etching width of the interlayer insulating film 101 is in a range of about 3 to 6 $\mu$m. After etching for the contactor hole, a metal film 102, made of tungsten (W) etc, to serve as a plug, is formed in a device part by the CVD method.

Thereafter, portions of the metal film 102, outside the contactor hole, are removed by etching back the entire surface thereof or by CMP thereof. However, since the width of the groove of the alignment measurement marks is generally wider as compared with the contactor hole not more than 0.5 $\mu$m in diameter, portions of the metal film 102, in a sidewall-like profile, are left out inside the groove in a mark region as shown in FIG. 1(B). In the case of using the CMP, there will be a high possibility that more of the metal film 102 is left out on the bottom of the groove. Subsequently, an interlayer insulating film 103 is deposited by the well-known method. The interlayer insulating film 103 includes not only a silicon oxide film but also a silicon nitride film in order to prevent oxidation of underlying tungsten (W).

Further, in a step preceding the step of forming a ferroelectric capacitor, and accurately matching the step of forming the out-box 100, the in-box 110 in the shape of a rectangle with sides in the order of 10 to 15 $\mu$m in length is patterned on a photo resist so as to be disposed inside the out-box 100. At this time, discrepancy between an alignment measurement mark of the out-box 100, and that of the in-box 110 is measured, and in case that the discrepancy is found greater than that as specified, re-patterning is executed.

Subsequently, etching is executed with the use of the photo resist as patterned. Further, a metal film 104, made of tungsten (W) etc, is formed by the CVD method, and portions of the metal film 104, other than those inside the contactor hole, are removed by etching back the entire surface thereof or by CMP thereof. Thereafter, a cover film 121 is deposited in the mark region. The cover film 121 is preferably a film capable of blocking out oxygen and plays a role in preventing oxidation of the metal films 102, 104 at the time of heat treatment at high temperature, applied to a ferroelectric film in a back-end step. With the present embodiment, there is deposited a metal film based on iridium (Ir), and so forth, corresponding to a lower electrode (an electrode deposited prior to the ferroelectric film) of the ferroelectric capacitor. A ferroelectric layer and an upper electrode layer, to be formed in later steps, may be placed above the cover film 121.

Steps where the metal films in the mark region undergo oxidation are applied mainly at the time of annealing for crystallization of the ferroelectric film, and at the time of heat treatment applied thereafter in order to restore ferro-electricity from process damage. Accordingly, as with a construction according to the present embodiment of the invention, if the lower electrode of the ferroelectric capacitor is constructed so as to have resistance against diffusion of oxygen, diffusion of oxygen of the metal films 102, 104, in underlying layers, respectively, is suppressed at the times of the heat treatments described above, so that oxidation of the metal films can be prevented.

Second Embodiment

Figure 2A:
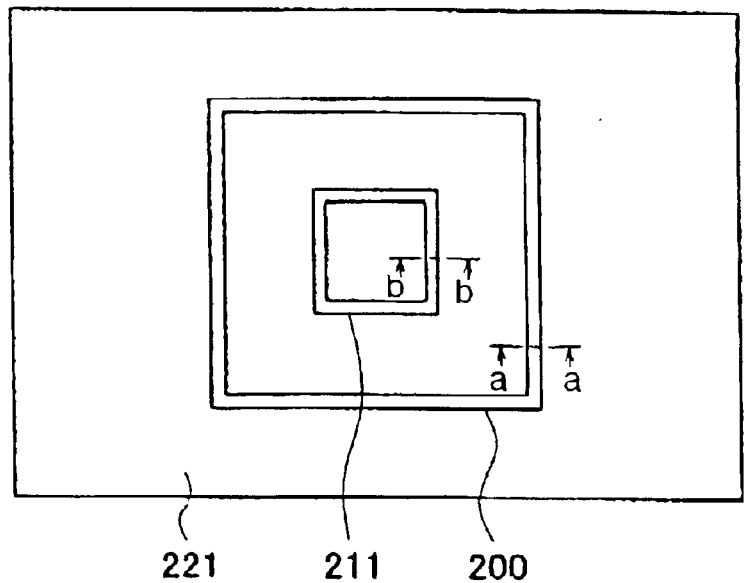
FIGS. 2(A) to 2(C) are views showing a second embodiment of alignment marks of a semiconductor device, according to the invention.
Figure 2B:
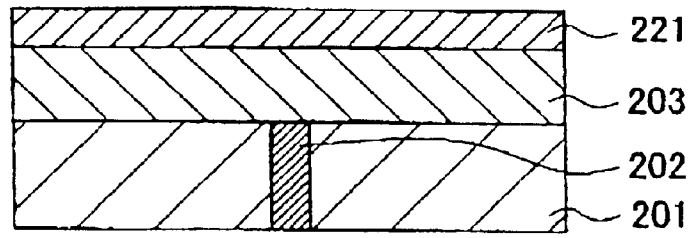
Figure 2C:
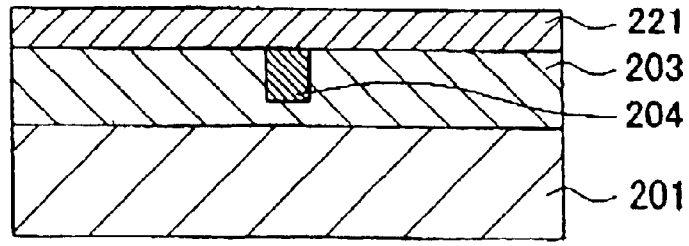

FIG. 2(A) is a schematic plan view of a second embodiment of alignment measurement marks according to the invention, FIG. 2(B) a sectional view thereof, taken along line a—a of an out-box shown in FIG. 2(A), and FIG. 2(C) a sectional view thereof, taken along line b—b of an in-box shown in FIG. 2(A). As with the first embodiment, an out-box 200 is formed in an alignment mark region in the step of defining a contactor hole in an interlayer insulating film 201. The present embodiment is characterized in that a groove thereof is rendered narrow in the order of 0.6 to 1.0 $\mu$m in width at that point in time, and a metal film 202 such as tungsten is formed in the groove.

Thereafter, an interlayer insulating film 203 is deposited, and an in-box 211 is formed with a photo resist in a step where alignment with the out-box 200 is required, thereby checking discrepancy therebetween. As with the out-box 200, the in-box 211 is formed at this point in time such that a groove thereof is also rendered narrow in the order of 0.6 to 1.0 $\mu$m in width. Subsequently, etching is executed with the use of the photo resist as patterned, a metal film 204, made of tungsten (W) etc, is further formed by the CVD method, and portions of the metal film, other than those inside the contactor hole, are removed by etching back the entire surface thereof or by CMP thereof. Thereafter, a cover film 221 for blocking out oxygen is deposited in the mark region.

Such a construction as described is intended to render a buried condition of metal wiring equivalent to that inside the contactor hole by causing the size of the groove of the alignment measurement marks to approximate to the diameter of the contactor hole. With the alignment measurement marks, it is difficult to render the groove not more than 0.6 $\mu$m in width because intensity of reflected light in the mark region is measured with an optical microscope. However, with the construction according to the present embodiment, a coating condition of the cover film 221 in the topmost layer is improved because a metal film 202 buried in a mark part (the out-box) is closer to a planar shape than the equivalent for the first embodiment, so that diffusion of oxygen can be better suppressed at the time of annealing for crystallization of a ferroelectric film, and at the time of annealing for restoration of ferroelectricity. With respect to the in-box as well, diffusion of oxygen can be suppressed for the same reason.

Figure 4:
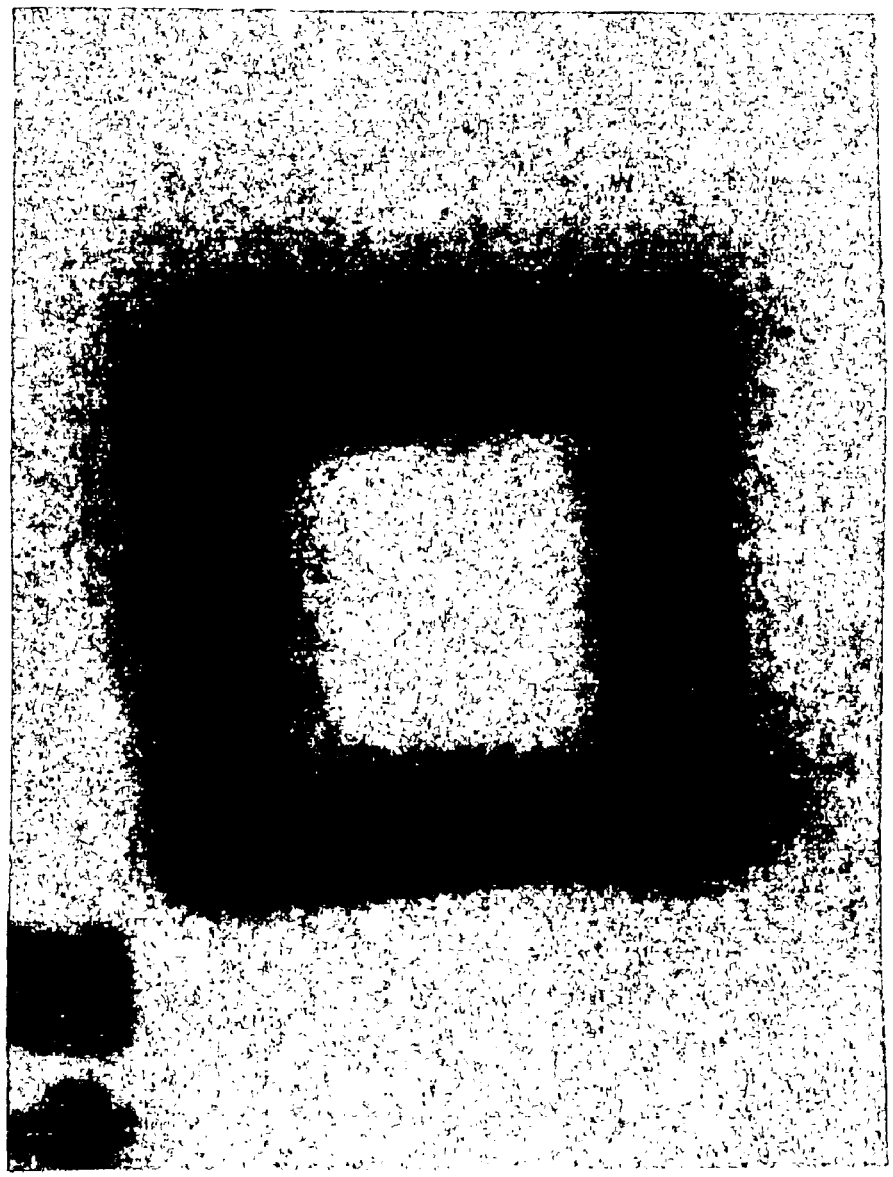
FIG. 4 is an optical micrograph showing an alignment mark outbox according to the first embodiment.
Figure 5:
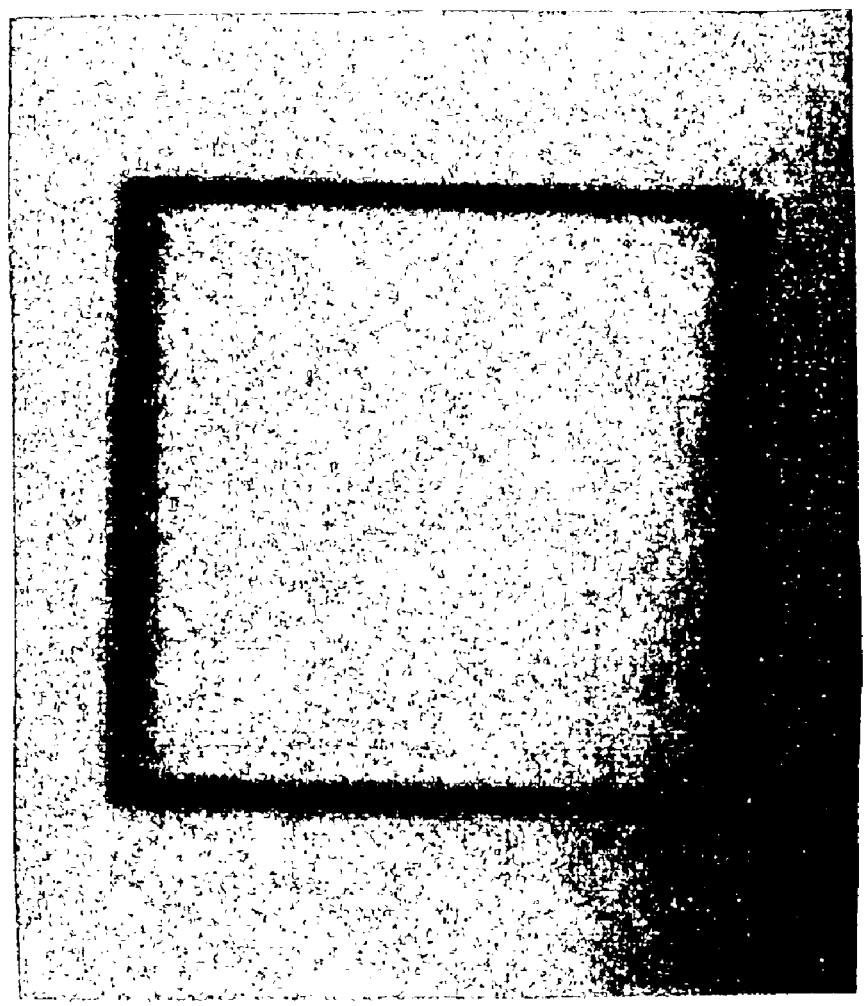
FIG. 5 is an optical micrograph showing an alignment mark outbox according to the second embodiment.
Figure 8B:
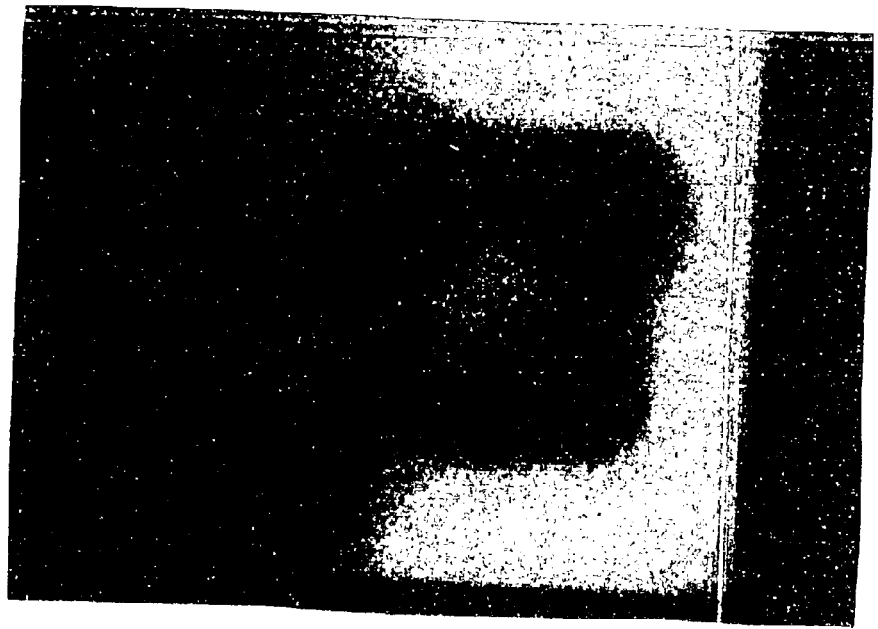
FIGS. 8(A) and 8(B) are optical micrographs of alignment marks of a semiconductor device, respectively, formed by the conventional technique, to which there has occurred distortion in shape due to oxidation, FIG. 8(A) showing an example of an in-box, and FIG. 8(B) showing an example of an out-box.
Figure 8A:
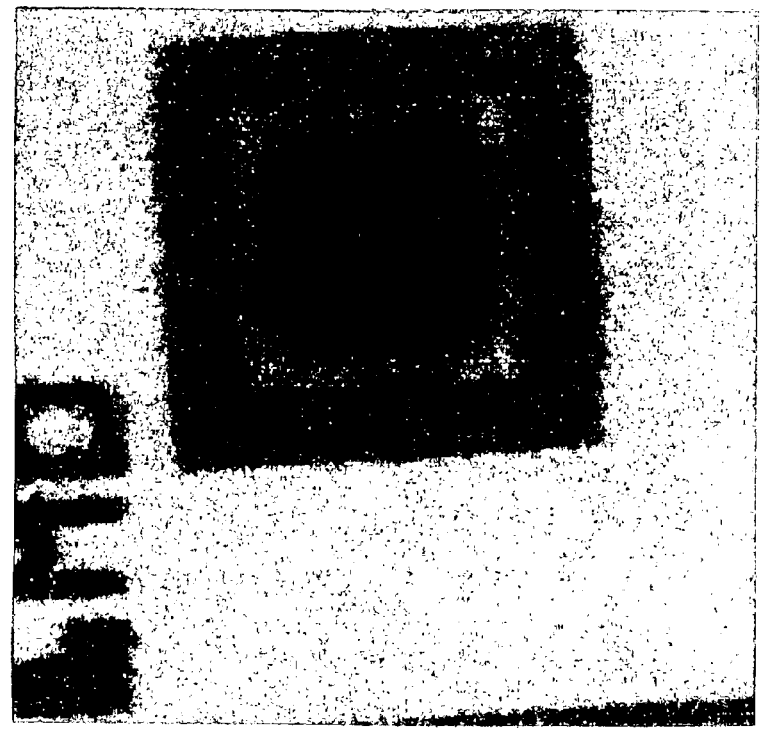

FIG. 4 shows an optical micrograph showing the result of a trial manufacture of the first embodiment. An extent to which oxidation has proceeded is found less as compared with the conventional case (refer to FIG. 8), but is far from satisfactory. The reason for a drawback with the first embodiment is that the mark part has a stepped-level profile with sidewalls, and consequently, a coating condition of a silicon nitride film intended for prevention of diffusion of oxygen in an upper layer and a lower electrode film of a ferroelectric capacitor, in a stepped part, is unsatisfactory, so that prevention of diffusion of oxygen can not be fully implemented. Accordingly, with the second embodiment, the grooves in the mark part are rendered narrower in width in order to correct the stepped-level profile. FIG. 5 shows an optical micrograph showing the result of a trial manufacture of the second embodiment. The mark part is found maintaining an excellent shape without any distortion due to oxidation being observed although subjected to heat treatments equivalent to those for the conventional case.

Third Embodiment

Figure 3A:
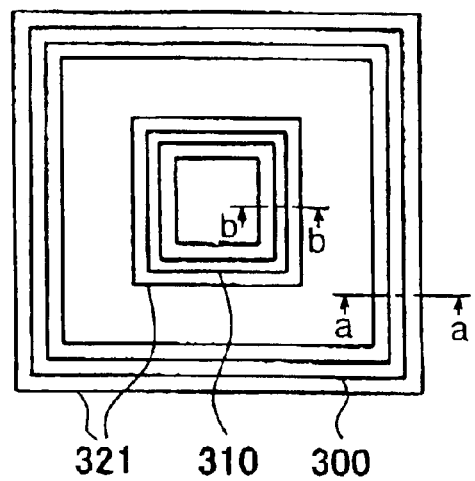
FIGS. 3(A) to 3(C) are views showing a third embodiment of alignment marks of a semiconductor device, according to the invention.
Figure 3B:
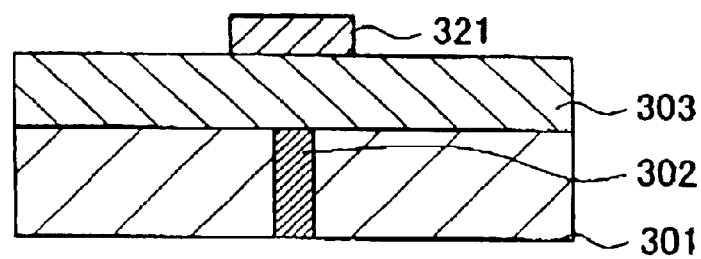
Figure 3C:
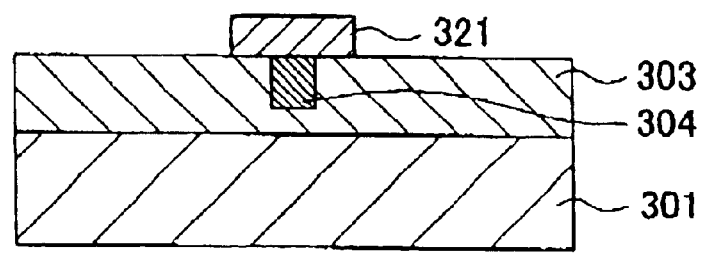

FIG. 3(A) is a schematic plan view of the construction of a third embodiment of alignment measurement marks according to the invention, FIG. 3(B) a sectional view thereof, taken along line a—a of an out-box shown in FIG. 3(A), and FIG. 3(C) a sectional view thereof, taken along line b—b of an in-box shown in FIG. 3(A). As with the second embodiment, at the time of defining a contactor hole in an interlayer insulating film 301, an out-box 300 is formed in an alignment mark region such that a groove thereof is rendered narrow in the order of 0.6 to 1.0 $\mu$m in width, a metal film 302 such as tungsten is formed in the groove, and subsequently, an interlayer insulating film 303 is deposited. Thereafter, an in-box 310 is formed with a photo resist in the step of aligning with the out-box 300, thereby checking discrepancy therebetween.

As with the out-box 300, the in-box 310 is also formed such that a groove thereof is rendered narrow in the order of 0.6 to 1.0 $\mu$m in width at this point in time. Subsequently, etching is executed with the use of the photo resist as patterned, a metal film 304 made of tungsten (W) etc, is further formed by the CVD method, and portions of the metal film, other than those inside the contactor hole, are removed by etching back the entire surface thereof or by CMP thereof.

Thereafter, a cover film 321 having an oxygen barrier characteristic is deposited in the mark region. In this connection, in the case of the second embodiment, the cover film of the marks is provided on the mark region in whole, however, the cover film 321 according to the present embodiment is characterized in that it is formed so as to cover a width larger by, for example, 1 to 2 $\mu$m than the width of the respective grooves formed in a mark part.

Figure 6:
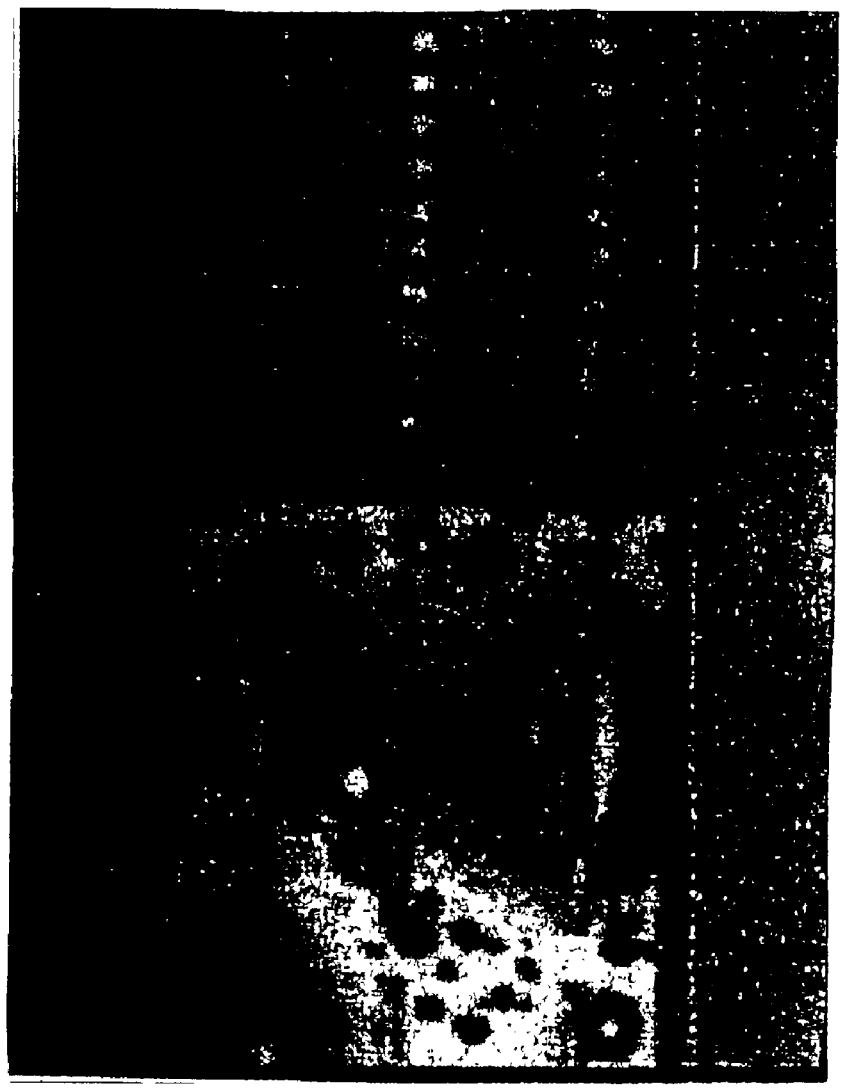
FIG. 6 is an optical micrograph showing an alignment mark outbox to which there has occurred exfoliation.
Figure 7A:
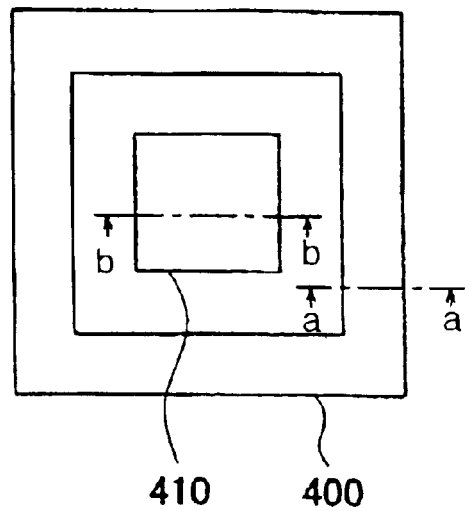
FIGS. 7(A) to 7(C) are views showing alignment marks of a semiconductor device, formed by a conventional technique.
Figure 7B:
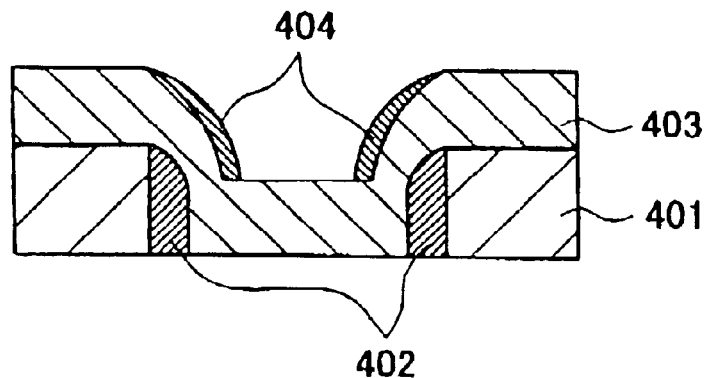
Figure 7C:
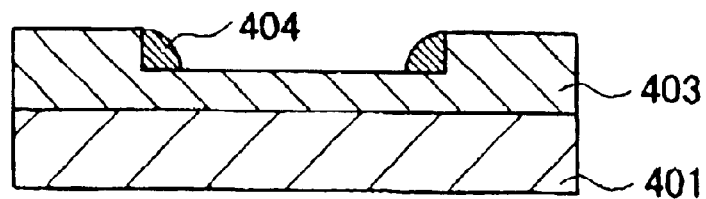

Upper and lower electrodes of a ferroelectric capacitor are generally electrodes made of a noble metal, and since an oxide film of the noble metal is difficult to be formed, the upper and lower electrodes on the whole have weak adhesion property against a silicon oxide film. Meanwhile, the electrodes themselves have very strong thermal stress, and accordingly, an interface between the silicon oxide film and the electrodes becomes quite prone to exfoliation in the case of increasing a thickness of an electrode film for the purposes of prevention of oxidation of metal films already formed underneath, and so forth. FIG. 6 shows a state where there has occurred exfoliation in back-end steps to portions covering the ferroelectric electrode with the cover film for protection of the mark region as with the cases of the first and second embodiments.

Thus, it is deemed that the cover film introduced for the purposes of preventing oxidation of the mark region can cause the marks to become susceptible to exfoliation contrary to the original intention. Accordingly, with the third embodiment, a pattern width of the cover film is rendered narrower to the extent of several $\mu$m although larger than the width of the respective grooves of the mark part, thereby obtaining an advantageous effect on exfoliation in the back-end steps while maintaining oxidation resistance, and particularly, considerably reducing the risk of exfoliation when depositing interlayer insulating films on top of a ferroelectric capacitor.

Preferred embodiments of the alignment marks of the semiconductor device, according to the invention, are described hereinbefore with reference to the accompanying drawings, however, the scope of the invention is not limited thereto. It is to be understood that various changes and modifications thereto will be apparent to those skilled in the art without departing from the spirit and the scope of the invention as hereinafter claimed, and should be considered within the scope of the invention.

With reference to the preferred embodiments of the invention, the alignment marks of the semiconductor device using the ferroelectrics is described, however, the invention is applicable to not only the semiconductor device using the high dielectrics but also all of common semiconductor devices wherein heat treatment in an oxygen atmosphere, such as, for example, the step of forming a thermal oxidation film, and so forth, is performed.

According to the invention described in the foregoing, with the semiconductor device comprising constituents that require heat treatment in an oxygen atmosphere, such as the ferroelectrics and the high dielectrics, it becomes possible to prevent oxidation of the marks by forming a film to cover the metal films and to block out oxygen at the time of the heat treatment applied in an oxygen atmosphere on top of the alignment marks each with the metal film formed in the groove formed in the respective interlayer insulating films, thereby solving a problem of exfoliation occurring to the marks while maintaining the intended function as the alignment marks.

What is claimed is:

1. An alignment mark of a semiconductor device being subjected to a heat treatment in an oxygen atmosphere, comprising:
   an insulating film;
   a groove formed in the insulating film;
   a metal formed in the groove;
   a first film, formed on the insulating film and covering at least the metal, for prevention of oxidation of the metal during heat treatment applied in the oxygen atmosphere; and
   a second insulating film formed between the insulating film and the first film.

2. The alignment mark of a semiconductor device according to claim 1, wherein the groove is formed during a step of defining a contactor hole of the semiconductor device.

3. The alignment mark of a semiconductor device according to claim 1, wherein the metal is formed during a step of burying a contactor hole of the semiconductor device.

4. The alignment mark of a semiconductor device according to claim 1, wherein the metal is formed at least on sidewalls of the groove.

5. The alignment mark of a semiconductor device according to claim 1, wherein the metal is buried in the groove.

6. The alignment mark of a semiconductor device according to claim 1, wherein the film for prevention of oxidation of the metal covers the alignment mark in whole.

7. The alignment mark of a semiconductor device according to claim 1, wherein the film for prevention of oxidation of the metal is a silicon nitride film.

8. An alignment mark comprising:

a first insulating film having a first groove;

a first metal having a sidewall profile formed on a side surface of the first groove;

a second insulating film formed on the first insulating film and the first metal, the second insulating film having a second loop groove surrounding the first groove;

a second metal having a sidewall profile formed on a side surface of the second loop groove; and a cover films formed on the second insulating film and the second metal, that prevents oxidation of the first and second metals.

9. The alignment mark according to claim 8, wherein the second insulating film has a step formed on the first groove, and wherein the second metal is formed on the step.

10. The alignment mark according to claim 8, wherein the cover film is a silicon nitride film.

11. An alignment mark comprising:

a first insulating film having a first groove;

a first metal having a sidewall profile formed on a side surface of the first groove;

a second insulating film formed on the first insulating film and the first metal, the second insulating film having a second loop groove surrounding the first groove;

a second metal having a sidewall profile formed on a side surface of the second loop groove; and a cover film formed to cover the second insulating film and the second metal, the cover film having an oxidation prevention property for protecting the first and second metals when the alignment mark is subjected to a heat treatment in an oxygen atmosphere.

12. The alignment mark according to claim 11, wherein the second insulating film has a step formed on the first groove, and wherein the second metal is formed on the step.

13. The alignment mark according to claim 11, wherein the cover film is a silicon nitride film.

14. The alignment mark of a semiconductor device according to claim 1, wherein the second insulating film includes a film that prevents oxidation of the metal.

* * * * *